(12) United States Patent
Huang et al.

(10) Patent No.: US 11,250,910 B2
(45) Date of Patent: Feb. 15, 2022

(54) CONTROL METHOD AND CONTROLLER OF A PROGRAMMING PROCESS FOR 3D NAND FLASH

(71) Applicant: Yangtze Memory Technologies Co., Ltd., Wuhan (CN)

(72) Inventors: Ying Huang, Wuhan (CN); Hongtao Liu, Wuhan (CN); Qiguang Wang, Wuhan (CN); Wenzhe Wei, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/891,028

(22) Filed: Jun. 2, 2020

(65) Prior Publication Data

US 2021/0350853 A1 Nov. 11, 2021

Related U.S. Application Data

(63) Continuation of application No. PCT/CN2020/088769, filed on May 6, 2020.

(51) Int. Cl.
| | | |
|---|---|---|
| *G11C 16/04* | (2006.01) | |
| *G11C 16/34* | (2006.01) | |
| *G11C 16/26* | (2006.01) | |
| *G11C 16/10* | (2006.01) | |
| *G11C 11/56* | (2006.01) | |

(52) U.S. Cl.
CPC .......... *G11C 16/0483* (2013.01); *G11C 16/10* (2013.01); *G11C 16/26* (2013.01); *G11C 16/3459* (2013.01); *G11C 11/5671* (2013.01)

(58) Field of Classification Search
CPC ..... G11C 16/0483; G11C 16/26; G11C 16/10; G11C 16/3459; G11C 16/3481; G11C 2211/5621; G11C 11/5671
See application file for complete search history.

(56) References Cited

U.S. PATENT DOCUMENTS

| | | | |
|---|---|---|---|
| 8,743,618 | B1 | 6/2014 | Kamei |
| 9,082,502 | B2 | 7/2015 | Dunga |
| 2007/0211536 | A1 | 9/2007 | Aritome |
| 2014/0169068 | A1 | 6/2014 | Lee |
| 2017/0140829 | A1 | 5/2017 | Park |

(Continued)

FOREIGN PATENT DOCUMENTS

| | | |
|---|---|---|
| CN | 101552037 A | 10/2009 |
| CN | 102132351 A | 7/2011 |

(Continued)

*Primary Examiner* — Gene N Auduong
(74) *Attorney, Agent, or Firm* — Winston Hsu

(57) ABSTRACT

A control method of a programming process for a three-dimensional (3D) NAND flash memory array comprises programming a bit-cell of the 3D NAND flash memory array in a programming stage; and verifying whether the bit-cell of the 3D NAND flash memory array is programmed in a verification stage after the programming stage; wherein the programming stage comprises programming the bit-cell of the 3D NAND flash memory array with a plurality of programming voltage pulses; wherein the verification stage comprises reading the bit-cell of the 3D NAND flash memory array with lower or higher voltage than normal reading voltage pulse.

16 Claims, 4 Drawing Sheets

(56) References Cited

U.S. PATENT DOCUMENTS

| | | | | |
|---|---|---|---|---|
| 2019/0043563 A1* | 2/2019 | Khakifirooz | ........ | G11C 11/5642 |
| 2019/0179573 A1* | 6/2019 | Hsu | ........ | G11C 11/005 |
| 2020/0043559 A1* | 2/2020 | Blodgett | ........ | G11C 16/0483 |
| 2020/0402553 A1* | 12/2020 | Koh | ........ | G11C 7/1006 |

FOREIGN PATENT DOCUMENTS

| CN | 102576567 A | 7/2012 |
|---|---|---|
| CN | 104835527 A | 8/2015 |
| CN | 109903799 A | 6/2019 |
| CN | 110619916 A | 12/2019 |
| CN | 110678926 A | 1/2020 |

* cited by examiner

CONTROL METHOD AND CONTROLLER OF A PROGRAMMING PROCESS FOR 3D NAND FLASH

CROSS REFERENCE TO RELATED APPLICATIONS

This is a continuation application of International Application No. PCT/CN2020/088769 filed on May 6, 2020, which are incorporated herein by reference in its entirety.

BACKGROUND OF THE INVENTION

1. Field of the Invention

The present invention relates to a control method and controller of 3D NAND flash, and more particularly, to a control method and controller capable of enhancing programming performance for the 3D NAND flash.

2. Description of the Prior Art

Semiconductor memories are widely used in various electronic devices such as cellular phones, digital cameras, personal digital assistants, medical electronic devices, mobile computing devices and non-mobile computing devices. A nonvolatile memory allows information to be stored and retained. Examples of the nonvolatile memory comprises a flash memory (e.g., NAND type and NOR type flash memory) and electrically erasable programmable read only memory (Electrically Erasable Programmable Read-Only Memory, EEPROM).

In the NAND flash, each memory element is configured to store a charge, voltage, or other electrical parameter to represent the data in a plurality of bit-cells (or memory elements), formed from floating-gate transistors. A programming process comprises a plurality of programming voltage pulses in a plurality of programming stages, wherein the voltages of the plurality of programming voltage pulses are increased by the value Vispp, to guarantee the programming is successful. However, with the development in multi-level cell (MLC), triple-level cell (TLC), and quad-level cell (QLC), the requirement of the programming time is more critical than before. That is, the number of programming voltage pulse (so-called pulse count) should be controlled well.

Therefore, it is necessary to improve the prior art.

SUMMARY OF THE INVENTION

It is, therefore, a primary objective of the present invention to provide a control method and controller of a 3D NAND flash to improve over disadvantages of the prior art.

An embodiment of the present invention discloses a control method of a programming process for a three-dimensional (3D) NAND flash memory array comprises programming a bit-cell of the 3D NAND flash memory array in a programming stage; and verifying whether the bit-cell of the 3D NAND flash memory array is programmed in a verification stage after the programming stage; wherein the programming stage comprises programming the bit-cell of the 3D NAND flash memory array with a plurality of programming voltage pulses; wherein the verification stage comprises reading the bit-cell of the 3D NAND flash memory array with a voltage lower or higher than a normal reading voltage pulse.

An embodiment of the present invention further discloses a controller for a programming process for a three-dimensional (3D) NAND flash memory array, comprising a storage unit, configured to store a program code; and a processing unit, configured to perform the following steps: programming a bit-cell of the 3D NAND flash memory array in a programming stage; and verifying whether the bit-cell of the 3D NAND flash memory array is programmed in a verification stage after the programming stage; wherein the programming stage comprises programming the bit-cell of the 3D NAND flash memory array with a plurality of programming voltage pulses; wherein the verification stage comprises reading the bit-cell of the 3D NAND flash memory array with a voltage lower or higher than a normal reading voltage pulse.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
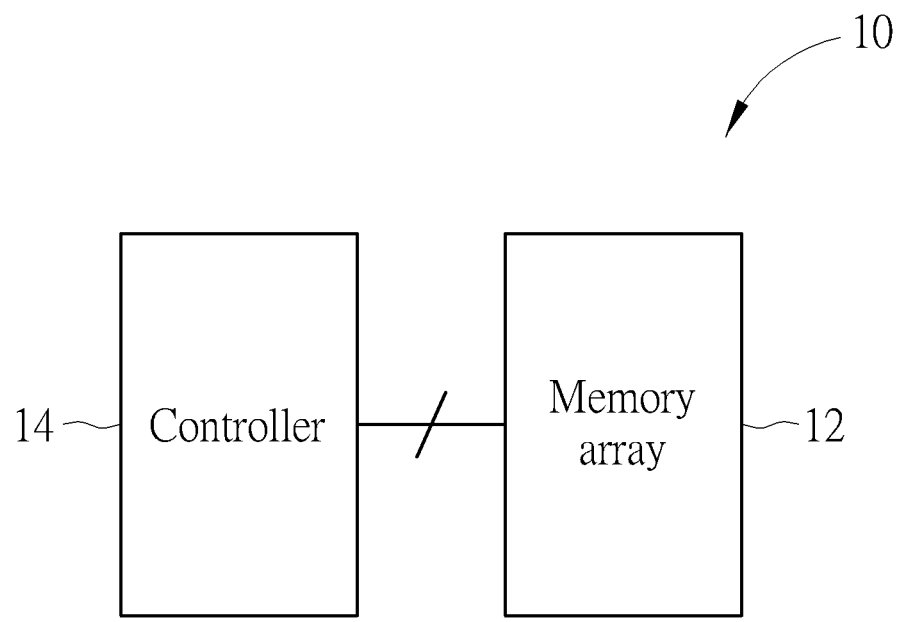
FIG. 1 is a schematic diagram of a memory system.

FIG. 1 is a schematic diagram of a memory system 10. The memory system 10 includes a memory array 12, which is configured to store data in the form of logic 0 or logic 1, and a controller 14, which is configured to receive external commands and to toggle the waveform to control the memory array 12. The bottom select gate line is enabled by the controller 14 toggling the waveforms or receives an external command. In an embodiment, the controller 14 may comprise a processor and a storage unit. The storage unit may store a program code to instruct the processor to perform the function of toggling the waveforms of the present invention. In addition, the processor may be a processing unit, an application processor (AP) or a digital signal processor (DSP), wherein the processing unit may be a central processing unit (CPU), a graphics processing unit (GPU) or a tensor processing unit (TPU), and not limited thereto. The storage unit may be a memory, which may be a non-volatile memory, such as an electrically erasable programmable read-only memory (EEPROM) or a flash memory, and not limited thereto.

Three-dimensional (3D) NAND flash includes a memory array, which includes many pages of memory elements.

Each memory element is configured to store a charge, voltage, or other electrical parameters to represent the data. However, with the increasing number of cells in each page, the programming time is increasing, too. A programming (or other equivalents) operation that is being processed at non-volatile memory (NVM) may be programmed by a plurality of programming voltage pulses in a plurality of programming stages, wherein the voltages of the plurality of programming voltage pulses are increased by the value Vispp, to guarantee the programming is successful.

More specifically, in the programming stage, the bit-cell is conducted, if the bit-cell is not "strong" enough, or the voltage of the charge-trapping line does not meet the threshold equivalently, then the bit-cell may turn to logic 0 from logic 1 during aging, and the reliability of 3D NAND flash is degraded. Therefore, a verification is required to examine whether the bit-cell is a "strong" logic 1 or "weak" logic 1 by measuring the voltage of a charge-trapping line.

Figure 2:
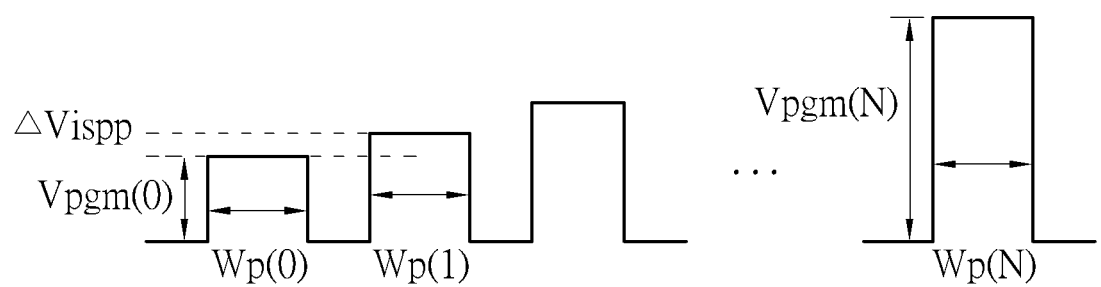
FIG. 2 is a schematic diagram of waveforms of a programming process for a bit-cell of a 3D NAND flash memory array in the prior art.

FIG. 2 is a schematic diagram of waveforms of a programming process for a bit-cell of a 3D NAND flash memory array in the prior art. As can be seen, the plurality of the programming voltage pulses is in the same pulse width, wherein the voltages in these pulses are increased by the value Vispp. This is because the bit-cell will be programed in a certain threshold voltage; that is, the bit-cell will be programmed until the programming voltage is greater than the threshold voltage with the constant pulse width. Finally, a verification stage is required to verify whether the programming is successful or not. In other words, the number of the programming voltage pulse (pulse count) in the programming stage is variant in each bit-cell. Therefore, the programming time will be variant accordingly.

In other words, the program operation may be performed using incremental pulses which incrementally increase the voltage level of each pulse, which in turn increases the voltage level stored at the bit-cell. However, with the development in multi-level cell (MLC), triple-level cell (TLC), and quad-level cell (QLC), the requirement of the programming time is more critical than before. In other word, the number of programming voltage pulses should be controlled well. For example, the bit-cell of the 3D NAND flash memory array cannot serve other requests during the programming voltage pulse; that is, the larger pulse counts, the shorter idle time which can serve other requests. In other words, the read latency will be increased as the number of pulse count increases.

Different from the prior art, a control method of the present invention performs the programming process for the bit-cell of the 3D NAND flash memory array by adjusting the voltages of the plurality of the programming voltage pulses and the pulse widths of the plurality of the programming voltage pulses in the programming stage. Thereby, the programming time of the bit-cell of the 3D NAND flash memory array may be shorten.

Figure 3A:
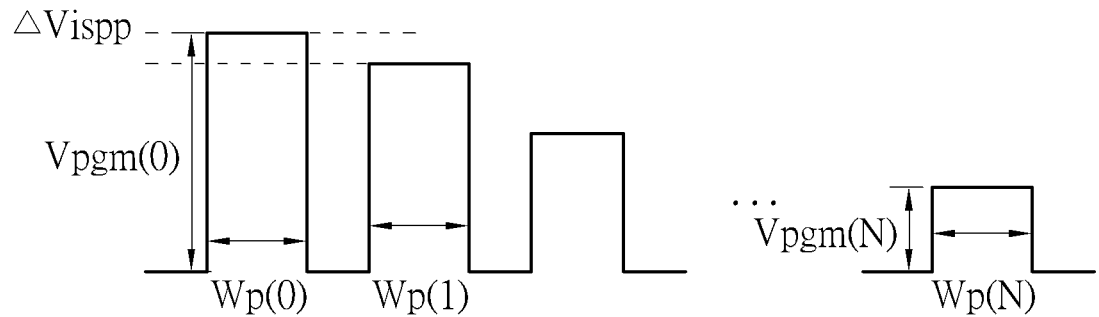
FIGS. 3A and 3B are schematic diagrams of waveforms of a programming process for a bit-cell of a 3D NAND flash memory array according to embodiments of the present invention.

For example, FIG. 3A is a schematic diagram of waveforms of a programming process for a bit-cell of a 3D NAND flash memory array according to an embodiment of the present invention. As shown in FIG. 3A, the pulse width of each programming voltage pulse is the same as that in the prior art, where the difference is the order of the plurality of programming voltage pulses. In other words, the voltage of plurality of programming voltage pulses in the embodiment of the present invention are increased, as mentioned above; in the prior art, however, the voltages of the plurality of the plurality of programming voltage pulses are decreased.

More specifically, the voltages of the plurality of the plurality of programming voltage pulses are decreased by Vispp, which is the same quantity as the incremental quantity in the prior art. For example, if the programming voltage pulse count is three, and the maximum programming voltage pulse is Vpgm+7Vispp, then the voltages of programming voltage pulses are Vpgm, Vpgm+Vispp, Vpgm+2Vispp in the prior art. However, the voltages of programming voltage pulses are Vpgm+7Vispp, Vpgm+6Vispp, Vpgm+5Vispp in the embodiment of the present invention. Therefore, the power inputted to the bit-cell of the present invention is greater than the power of the prior art, so as to make the programming voltage pulse count to be less in comparison to the prior art.

Figure 3B:
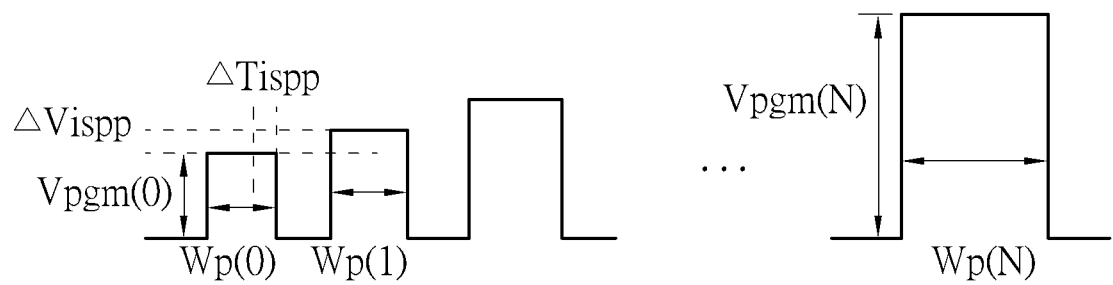

FIG. 3B is a schematic diagram of waveforms of a programming process for a bit-cell of a 3D NAND flash memory array according to an embodiment of the present invention. As can be seen, the pulse widths of the plurality of the plurality of programming voltage pulses are increased by Tispp, For example, the first three pulse widths of the programming voltage pulses are Tpgm, Tpgm+Tispp, Tpgm+2Tispp. Similarly, the programming time may be reduced because it may save the ramping time for power amplifier to each programming voltage pulse.

Notably, the reading window margin would be reduced if pulse width is increased, and the 3D NAND flash memory array may not rapidly respond to the read request so that the read latency may be increased. Therefore, those skilled in the art may make the balance of performance between programming and reading.

More specifically, the distribution width of the threshold voltage Vt in the high state is narrower because the distribution of Vt in the high programming state is required to be more convergent. In other words, the pulse width of the higher voltage of the programming voltage pulse may be less than the pulse width of the lower voltage of the programming voltage pulse due to the process of the 3D NAND flash.

Figure 4:
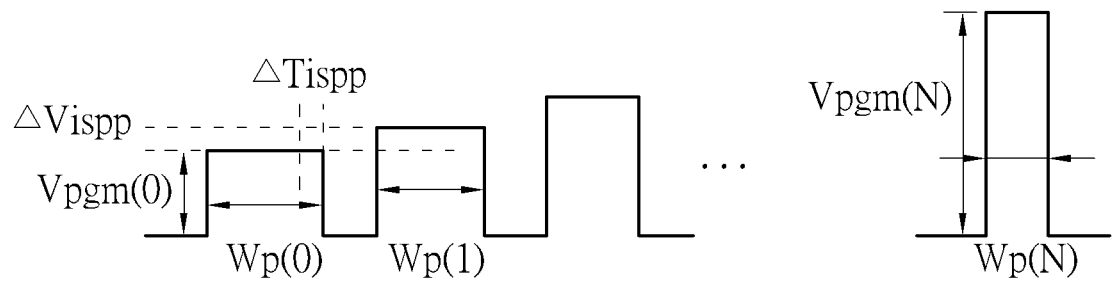
FIG. 4 is a schematic diagram of waveforms of a programming process for a bit-cell of a 3D NAND flash memory array according to an embodiment of the present invention.

For example, the advantages of the methods illustrated in FIG. 3A and FIG. 3B may be combined. Please refer to FIG. 4, which is a schematic diagram of waveforms of a programming process for a bit-cell of a 3D NAND flash memory array according to an embodiment of the present invention. As shown in FIG. 4, the voltages of the plurality of programming voltage pulses are decreased by Vispp, and the pulse widths of the plurality of programming voltage pulses are decreased by Tispp.

Figure 5:
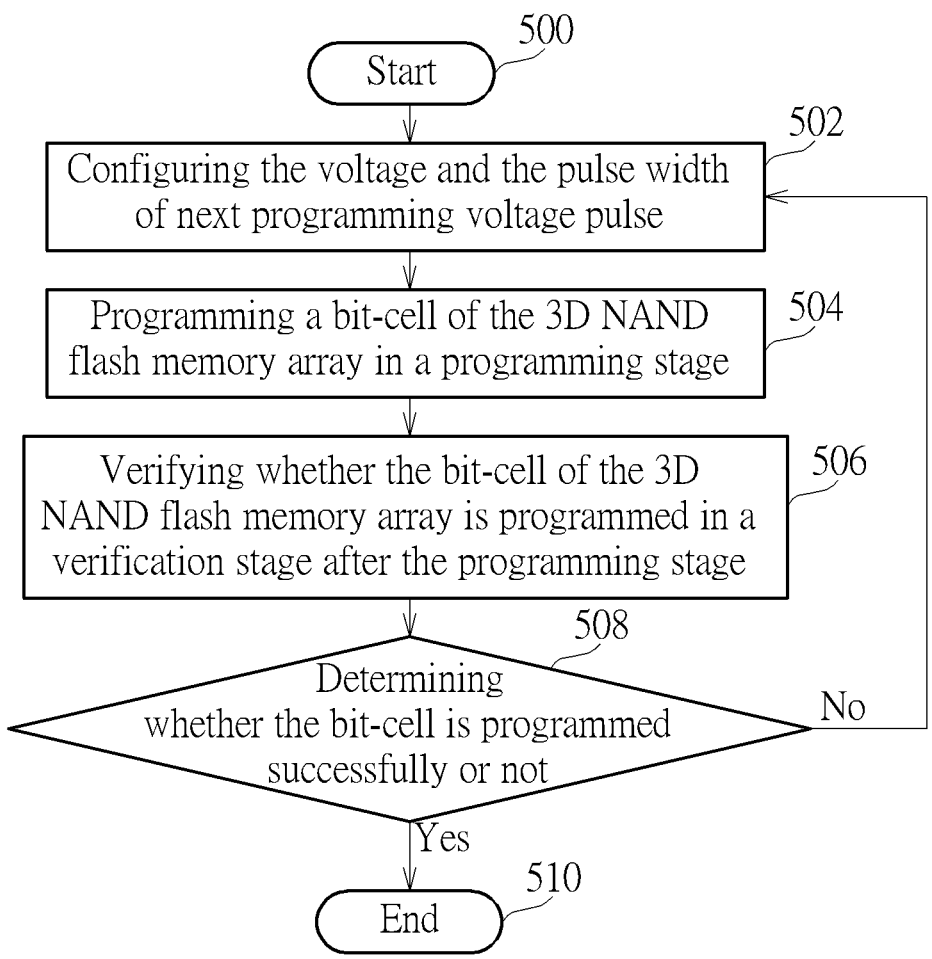
FIG. 5 is a schematic diagram of a programming process for a memory system according to an embodiment of the present invention.

The operation of the programming process of the present invention may be summarized to a programming process 50, as shown in FIG. 5. The programming process 50 comprises the following steps:

Step 500: Start.

Step 502: Configuring the voltage and the pulse width of next programming voltage pulse.

Step 504: Programming a bit-cell of the 3D NAND flash memory array in a programming stage.

Step 506: Verifying whether the bit-cell of the 3D NAND flash memory array is programmed in a verification stage after the programming stage.

Step 508: Determining whether the bit-cell is programmed successfully or not, if yes, go to Step 510; if no, go to Step 502.

Step 510: End.

In Step 502, the initial voltage of the plurality of voltage pulse and the initial pulse width may be adjustable according to different utilization scenarios. In an embodiment, the voltage of the programming voltage pulse and the pulse width may be a fixed value by pre-determining, calibration, determined by a mapping table, or adjusted accordingly to fit the practical scenario, which are corresponding to the voltage, the current, the temperature, the age or their combination thereof. Those skilled in the art may make modifications of the decision rule and alterations accordingly, and not limited herein.

Figure 6:
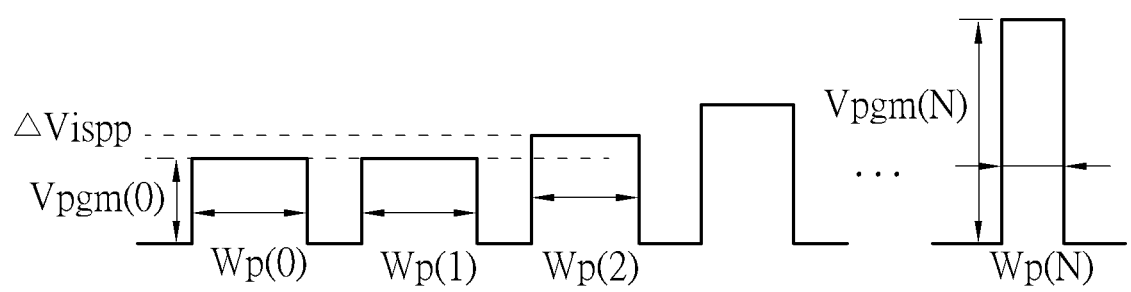
FIG. 6 is a schematic diagram of waveforms of a programming process for a bit-cell of a 3D NAND flash memory array according to an embodiment of the present invention.

In addition, in Step 502, the plurality of voltages and the pulse widths of the plurality of the programming voltage pulses may be decremental instead of being incremental. For example, FIG. 6 is a schematic diagram of waveforms of a programming process for a bit-cell of a 3D NAND flash memory array according to an embodiment of the present invention. As shown in FIG. 6, the first three voltages of the programming voltage pulses are Vpgm, Vpgm, Vpgm+Vispp. Similarly, the plurality of voltages and the pulse widths of the plurality of the programming voltage pulses may be partially decremental.

In Step 504, the programming process 50 may be modified to have a verification stage to follow a plurality of programming stages in sequence. For example, in an embodiment, the programming process 50 may comprise a first programming stage and a second programming stage, followed by a verification stage.

In Step 506, the controller 14 may read the memory in the stress criteria; that is, the controller 14 may read the data from the bit-cell of the 3D NAND flash memory array with a voltage lower or higher than normal reading voltage pulse in the verification stage. As can be seen, if the data in the bit-cell is stored by the high resistance, then the controller may use the lower voltage to read to guarantee the data in the bit-cell is with the resistance high enough, and vice versa, which is not narrated herein for brevity. For example, if the normal reading voltage is 3.3V, i.e., the 3D NAND flash memory operates for reading at 3.3V, then the verification voltage in the present invention may be 2V, which is lower than 3.3V, or 5V, which is higher than 3.3V, to read the 3D NAND flash memory to guarantee the data in the bit-cell is with the resistance high (or low) enough.

In addition, the voltage of each programming voltage pulse may not be a multiple of Vispp. For example, the first three voltages of the programming voltage pulses may be Vpgm, Vpgm+0.2, Vpgm+0.6, Vpgm+0.9 (volt), . . . That is, the voltages of the plurality of the programming voltage pulses may be adjusted, and the pulse widths of the plurality of the programming voltage pulses are similar thereto.

The detailed operation of the programming progress 50 may be referred to the foregoing description, which is not narrated herein for brevity.

Practically, if the verification stage (Step 506) of the programming process 50 is failed because the controller 14 determines that the logic 1 of a bit-cell is not strong enough, then the controller 14 may repeat the programming process 50 to guarantee that the bit-cell is accurately programmed. Moreover, if the verification stage (Step 506) is failed too many times, then the programming process 50 may be regarded as failed and the controller 14 may output an error message to the external system. The criteria to determine the failure of the programming process 50 is not limited, and may be based on a threshold time, a threshold number of performing erasing and verification process for the 3D NAND flash, or any combination thereof. Those skilled in the art may make modifications of the decision rule and alterations accordingly, and not limited herein.

In an embodiment, the 3D NAND flash memory array may comprise a top select gate line, a bottom select gate line, a charge-trapping line, a common-source line, and a p-well line. In the programming stage, the programming waveform is inputted to store data in the form of logic 0 or logic 1. However, the interface of the bit-cell of the 3D NAND flash memory array is not limited hereinabove, and those skilled in the art may make modifications and alterations according to the 3D NAND flash memory array in the whole system.

Notably, the embodiments stated in the above are utilized for illustrating the concept of the present invention. Those skilled in the art may make modifications and alterations accordingly, and not limited herein. Hence, as long as the voltages of the plurality of the programming voltage pulses and the pulse widths of the plurality of the programming voltage pulses in the programming stage may be adjusted or programmable, the requirement of the present application is satisfied.

In summary, by adjusting the voltages of the plurality of the programming voltage pulses and the pulse widths of the plurality of the programming voltage pulses in the programming stage, the method and controller of the 3D NAND flash in the present application have advantages of reducing the programming voltage pulse counts in the programming process, which may reduce the programming time for the bit-cell of a 3D NAND flash memory array, so as to enhance programming performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control method of a programming process for a three-dimensional (3D) NAND flash memory array, comprising:
   programming a bit-cell of the 3D NAND flash memory array in a programming stage; and
   verifying whether the bit-cell of the 3D NAND flash memory array is programmed in a verification stage after the programming stage;
   wherein the programming stage comprises:
      programming the bit-cell of the 3D NAND flash memory array with a plurality of programming voltage pulses;
      wherein in the programming stage, a voltage and a pulse width of each of the plurality of programming voltage pulses are programmable;
      wherein pulse widths of the plurality of programming voltage pulses are incremental;
   wherein the verification stage comprises:
      reading the bit-cell of the 3D NAND flash memory array with a voltage lower or higher than a normal reading voltage pulse.

2. The control method of claim 1, wherein voltages of the plurality of programming voltage pulses are incremental.

3. The control method of claim 1, wherein voltages of the plurality of programming voltage pulses are decremental.

4. The control method of claim 1, wherein voltages of a part of the plurality of programming voltage pulses are incremental.

5. The control method of claim 1, wherein voltages of a part of the plurality of programming voltage pulses are decremental.

6. A control method of a programming process for a three-dimensional (3D) NAND flash memory array, comprising:
   programming a bit-cell of the 3D NAND flash memory array in a programming stage; and verifying whether the bit-cell of the 3D NAND flash memory array is programmed in a verification stage after the programming stage;

wherein the programming stage comprises:

programming the bit-cell of the 3D NAND flash memory array with a plurality of programming voltage pulses;

wherein in the programming stage, a voltage and a pulse width of each of the plurality of programming voltage pulses are programmable;

wherein pulse widths of the plurality of programming voltage pulses are decremental;

wherein the verification stage comprises:

reading the bit-cell of the 3D NAND flash memory array with a voltage lower or higher than a normal reading voltage pulse.

7. A control method of a programming process for a three-dimensional (3D) NAND flash memory array, comprising:

programming a bit-cell of the 3D NAND flash memory array in a programming stage; and verifying whether the bit-cell of the 3D NAND flash memory array is programmed in a verification stage after the programming stage;

wherein the programming stage comprises:

programming the bit-cell of the 3D NAND flash memory array with a plurality of programming voltage pulses;

wherein in the programming stage, a voltage and a pulse width of each of the plurality of programming voltage pulses are programmable;

wherein pulse widths of a part of the plurality of programming voltage pulses are incremental;

wherein the verification stage comprises:

reading the bit-cell of the 3D NAND flash memory array with a voltage lower or higher than a normal reading voltage pulse.

8. A control method of a programming process for a three-dimensional (3D) NAND flash memory array, comprising:

programming a bit-cell of the 3D NAND flash memory array in a programming stage; and verifying whether the bit-cell of the 3D NAND flash memory array is programmed in a verification stage after the programming stage;

wherein the programming stage comprises:

programming the bit-cell of the 3D NAND flash memory array with a plurality of programming voltage pulses;

wherein in the programming stage, a voltage and a pulse width of each of the plurality of programming voltage pulses are programmable;

wherein pulse widths of a part of the plurality of programming voltage pulses are decremental;

wherein the verification stage comprises:

reading the bit-cell of the 3D NAND flash memory array with a voltage lower or higher than a normal reading voltage pulse.

9. A controller for a programming process for a three-dimensional (3D) NAND flash memory array, comprising:

a storage unit, configured to store a program code; and a processing unit, configured to perform the following steps:

programming a bit-cell of the 3D NAND flash memory array in a programming stage; and verifying whether the bit-cell of the 3D NAND flash memory array is programmed in a verification stage after the programming stage;

wherein the programming stage comprises:

programming the bit-cell of the 3D NAND flash memory array with a plurality of programming voltage pulses;

wherein in the programming stage, a voltage and a pulse width of each of the plurality of programming voltage pulses are programmable;

wherein pulse widths of the plurality of programming voltage pulses are incremental;

wherein the verification stage comprises:

reading the bit-cell of the 3D NAND flash memory array with a voltage lower or higher than a normal reading voltage pulse.

10. The controller for claim 9, wherein voltages of the plurality of programming voltage pulses are incremental.

11. The controller of claim 9, wherein voltages of the plurality of programming voltage pulses are decremental.

12. The controller of claim 9, wherein voltages of a part of the plurality of programming voltage pulses are incremental.

13. The controller of claim 9, wherein voltages of a part of the plurality of programming voltage pulses are decremental.

14. A controller for a programming process for a three-dimensional (3D) NAND flash memory array, comprising:

a storage unit, configured to store a program code; and a processing unit, configured to perform the following steps:

programming a bit-cell of the 3D NAND flash memory array in a programming stage; and verifying whether the bit-cell of the 3D NAND flash memory array is programmed in a verification stage after the programming stage;

wherein the programming stage comprises:

programming the bit-cell of the 3D NAND flash memory array with a plurality of programming voltage pulses;

wherein in the programming stage, a voltage and a pulse width of each of the plurality of programming voltage pulses are programmable;

wherein pulse widths of the plurality of programming voltage pulses are decremental;

wherein the verification stage comprises:

reading the bit-cell of the 3D NAND flash memory array with a voltage lower or higher than a normal reading voltage pulse.

15. A controller for a programming process for a three-dimensional (3D) NAND flash memory array, comprising:

a storage unit, configured to store a program code; and a processing unit, configured to perform the following steps:

programming a bit-cell of the 3D NAND flash memory array in a programming stage; and verifying whether the bit-cell of the 3D NAND flash memory array is programmed in a verification stage after the programming stage;

wherein the programming stage comprises:

programming the bit-cell of the 3D NAND flash memory array with a plurality of programming voltage pulses;

wherein in the programming stage, a voltage and a pulse width of each of the plurality of programming voltage pulses are programmable;

wherein pulse widths of a part of the plurality of programming voltage pulses are incremental;
wherein the verification stage comprises:
reading the bit-cell of the 3D NAND flash memory array with a voltage lower or higher than a normal reading voltage pulse.

16. A controller for a programming process for a three-dimensional (3D) NAND flash memory array, comprising:
a storage unit, configured to store a program code; and
a processing unit, configured to perform the following steps:
programming a bit-cell of the 3D NAND flash memory array in a programming stage; and
verifying whether the bit-cell of the 3D NAND flash memory array is programmed in a verification stage after the programming stage;
wherein the programming stage comprises:
programming the bit-cell of the 3D NAND flash memory array with a plurality of programming voltage pulses;
wherein in the programming stage, a voltage and a pulse width of each of the plurality of programming voltage pulses are programmable;
wherein pulse widths of a part of the plurality of programming voltage pulses are decremental;
wherein the verification stage comprises:
reading the bit-cell of the 3D NAND flash memory array with a voltage lower or higher than a normal reading voltage pulse.

* * * * *